United States Patent [19]
Kachi et al.

[11] Patent Number: 5,677,686
[45] Date of Patent: Oct. 14, 1997

[54] ABSOLUTE POSITION DETECTION APPARATUS AND ERROR COMPENSATION METHODS THEREFOR

[75] Inventors: Mitsuyasu Kachi; Hirokazu Sakuma; Tsutomu Kazama; Yukio Aoki; Takao Mizutani, all of Aichi, Japan

[73] Assignee: Mitsubishi Denki Kabushiki Kaisha, Tokyo, Japan

[21] Appl. No.: 379,739

[22] Filed: Jan. 27, 1995

[30] Foreign Application Priority Data

Jan. 28, 1994 [JP] Japan .......................... 6-8870

[51] Int. Cl.$^6$ .......................................... H03M 1/00
[52] U.S. Cl. ............................................ 341/8; 341/115
[58] Field of Search ............................. 341/8, 11, 115

[56] References Cited

U.S. PATENT DOCUMENTS

| | | | |
|---|---|---|---|
| 4,318,617 | 3/1982 | Orsen | 356/373 |
| 5,155,696 | 10/1992 | Shibata et al. | 364/571.01 |
| 5,239,490 | 8/1993 | Masaki et al. | 364/565 |
| 5,463,393 | 10/1995 | Havlicsek | 341/115 |

FOREIGN PATENT DOCUMENTS

| | | | |
|---|---|---|---|
| 0377045 | 7/1990 | European Pat. Off. | G01D 5/36 |
| 0599175 | 6/1994 | European Pat. Off. | G01D 5/244 |
| 4029828 | 4/1991 | Germany | G01B 7/30 |

*Primary Examiner*—Howard L. Williams
*Attorney, Agent, or Firm*—Sughrue, Mion, Zinn, Macpeak & Seas

[57] ABSTRACT

An absolute position detection apparatus which comprises sine and cosine wave generators for generating one or more sets of sine and cosine waves within a cycle, analog-to-digital converters for converting the incoming sine and cosine waves generated by the sine and cosine wave generators into digital values. An arithmetic unit is used for calculating a compensation for errors including offset, amplitude and phase errors on the basis of the digital values from the analog-to-digital converters. In the apparatus, the arithmetic unit operates on a phase angle from phase angles found by the arithmetic performed prior to or during said error compensations and the digital values from the analog-to-digital converters, whereby a low-priced, highly reliable absolute position detection apparatus can be achieved without the addition of compensation circuits to the hardware.

21 Claims, 17 Drawing Sheets

AMPLITUDE COMPENSATION IN CONSIDERATION OF SPEED $\omega 0$ : CURRENT SPEED
A : DIVISION SPEED OF SPEED AMPLITUDE COMPENSATION VALUE

ABSOLUTE POSITION DETECTION APPARATUS AND ERROR COMPENSATION METHODS THEREFOR

BACKGROUND OF THE INVENTION

1. Field of the Invention

The present invention relates to an absolute position detection apparatus, which detects the position of a machine tool, an industrial machine, a robot or the like, and error compensation methods for that apparatus.

2. Description of the Background Art

FIG. 20 is a block diagram of a conventional absolute position detection apparatus, wherein line 20 and lines connected thereto indicate block-to-block connections and the remaining lines represent signals transferred. In FIG. 20, the numerals 1a and 1b denote analog input sections for sine waves; 2a and 2b designate analog input sections for cosine waves; 3 indicates a sampling hold device which triggers signals from the analog input sections 1a, 1b, 2a, 2b; 4a denotes a sine-wave input selecting analog switch, 4b represents a cosine-wave input selecting analog switch; 5a designates an analog-to-digital converter intended to convert an incoming analog sine-wave value into a digital value, and 5b indicates an analog-to-digital converter designed to convert an incoming analog cosine-wave value into a digital value; 6 designates a memory stored with angle data equivalent to the digital values provided by the analog-to-digital converters 5a, 5b; 17 denotes a CPU which composes data output from the memory 6 and changes the compensation values of analog compensators 16a, 16b described later; 9 represents nonvolatile memory which stores various compensation values mentioned later; 15 indicates a logic section which creates a format for data communication with an external device; 10 denotes an input/output section for the logic section 15; 11 designates a multi-revolution data creation section; 12 represents an analog voltage generator which generates an integral multiple of analog output voltage during a single revolution or a fundamental length in an optical, magnetic or any other manner (which consists of light-emitting devices, glass scales and light-receiving devices if it uses an optical system); and 14 indicates an analog input controller which selects between data sampling hold and analog-to-digital conversion channels. Also, 16a and 16b represent analog compensators which compensate for offset, amplitude and other values on an analog basis and comprise adders or amplifiers, for example. Finally, 18 denotes a compensation converter including means which outputs the compensation values from the analog compensators 16a, 16b according to the analog-to-digital conversion channels or means which selects data in the analog compensators 16a, 16b to be analog-to-digital converted.

The operation of the conventional absolute position detection apparatus arranged as mentioned above will now be described. The analog voltages generated by the analog voltage generator 12 are amplified by the analog input sections 1a, 1b or 2a, 2b. The CPU 17 then generates a signal which simultaneously triggers the analog voltages when they are desired to be converted, and the analog voltages in all phases are held by the sample and hold device 3. The CPU 17 causes the analog input controller 14 to generate the channel select signals of the analog switches 4a, 4b, whereby the analog voltages held pass through the analog compensators 16a, 16b and are converted into digital values by the analog-to-digital converters 5a, 5b in sequence. The resultant digital values SIN(A), COS(A) are entered into the memory 6 as an address and the memory 6 outputs tan−1(A) data corresponding to said address. The CPU 17 reads this data to obtain angle information. Since SIN(A) and COS(A) include offset errors, unbalanced, too large or too small amplitudes, and a shift between two phases, the analog compensators 16a, 16b designed to compensate for such errors are disposed in front of the analog-to-digital converters 5a, 5b to eliminate these errors.

A specific example of the analog compensators 16a, 16b will now be described in accordance with FIG. 21. Compensations will be performed in sequence of offset, amplitude and phase compensations. In FIG. 21, 101a and 101b indicate variable resistors which perform the offset compensations of sine and cosine waves, respectively. 102a and 102b denote variable resistors which adjust amplitude values, and 103a and 103b represent variable resistors which adjust gains after phase compensations. After passing through these circuits, the original signals are entered into the analog-to-digital converters 5a, 5b to compensate for their errors.

Namely, amplifiers 104a, 104b in a first stage, which perform offset compensations, add offset voltages to the incoming sine and cosine waves. Amplifiers 105a, 105b in a second stage, which perform amplitude compensations, are adjusted by feedback resistors 102a, 102b to change output gains. Amplifiers 106a, 106b, 106c in a third stage, which perform phase compensations between the sine and cosine waves, add and subtract the incoming amplitude-compensated waves to convert them into two orthogonal phases.

FIG. 22 shows a method for compensating for the phases between the sine and cosine waves. Now it is assumed that the cosine-wave value proximate to $\theta=0$ is shifted by only $e°$ as shown in the drawing. Here, when $A=\text{SIN}\theta+\text{COS}\theta$ and $B=\text{SIN}\theta-\text{COS}\theta$ are operated on, A and B always intersect orthogonally to each other if the amplitudes and offsets have been compensated for correctly. It is to be noted that the phase shifts by only $(45\pm e/2)°$.

While the compensators consisting of the variable resistors as in FIG. 20 cannot change the compensations according to temperature changes, etc., a choice from among several fixed resistors provided allows for adequate compensations. In addition, as shown in FIG. 23, a digital-to-analog converter 301 may be provided in an amplifier 300 to change compensation values during operation. In this case, compensation value changes, etc. are governed by the compensation converter 18 in FIG. 20. It is to be understood that 302 in FIG. 23 indicates a CPU.

In the conventional absolute position detection apparatus designed as described above, the multiplicity of variable resistors in the compensation circuits were influenced by changes in temperature and changes with time, resulting in accuracy deterioration. The compensation circuits themselves also changed with temperature and with time.

Also, the number of compensation circuits required was the same as that of sine and cosine waves processed, leading to a large burden to the hardware.

Also, while error variations may be overcome to some degree by installing the digital-to-analog converters in the corresponding circuits in place of the variable resistors, this also increased a burden to the hardware.

Further, although offset-compensated outputs (OFSO, OFCO) and amplitude-compensated outputs (AMSO, AMCO) are required for the circuits shown in FIG. 21 to perform the compensations more correctly, the conventional absolute position detection apparatus analog-to-digital converts and detects only the phase-compensated outputs, resulting in a difficulty to grasp independent errors. Particularly, if two signals different in amplitude are composed in sine- and cosine-wave compensations, two orthogonal signals cannot be created.

In the meantime, a technique disclosed in Japanese Laid-Open Patent Publication No. SHO59-183327, for example, is known as a prior art technique. In this technique, wherein maximum and minimum values are peak held, an offset voltage is found from the sum of the voltages held, and an amplitude is found from the difference therebetween, a large number of analog circuits, e.g. four peak hold circuits and addition/subtraction circuits, are required for the entry of a single waveform, resulting in errors produced by the circuits themselves and faults of parts. Also, noise, if any, must be removed from the peak hold circuits.

Also, in the conventional techniques, angle data detected is not output in the form of proper data units that are compatible with an external device or are otherwise in the form of data demanded and the external device itself must convert the data output. Accordingly, an external device low in capability cannot process all data, and even the device is high in capability, it will waste arithmetic time.

Further, functions to monitor and correct a compensation status in the absolute position detection apparatus from the external device through communication were not provided, resulting in low reliability of the entire system.

SUMMARY OF THE INVENTION

It is a first object of the present invention to provide an absolute position detection apparatus and error compensation methods therefor which perform all error compensations by means of software and do not have compensating hardware.

It is a second object of the present invention to achieve a high-accuracy absolute position detection apparatus and error compensation methods therefor which have various functions and perform compensations in response to environmental changes.

The first feature of the invention, as described above, achieves an absolute position detection apparatus which comprises sine and cosine wave generators for generating one or more sets of sine and cosine waves within a cycle, analog-to-digital converters for converting the incoming sine and cosine waves generated by said sine and cosine wave generators into digital values, and an arithmetic unit for performing arithmetic to compensate for errors including offset, amplitude and phase errors on the basis of the digital values from said analog-to-digital converters. In the apparatus, the arithmetic unit operates on a phase angle from phase angles found prior to or during said error compensations and the digital values from said analog-to-digital converters, whereby a low-priced, highly reliable absolute position detection apparatus can be achieved without the addition of compensation circuits to the hardware.

A second feature of the present invention achieves an error compensation method for the absolute position detection apparatus wherein if a current speed range or angle and speed ranges are satisfied, the maximum and minimum values of the incoming sine and cosine waves are stored, the center values of incoming waveform peak voltages are found, and shift values from reference values are subtracted as offset values to perform an offset compensation. With this approach, there is provided an offset compensation method for the absolute position detection apparatus which can perform a high-accuracy offset compensation in response to changes in temperature and changes with time and is excellent in detection and reliability.

A third feature of the present invention involves an error compensation method for an absolute position detection apparatus wherein if a current speed range or angle and speed ranges are satisfied, the maximum and minimum values of the incoming sine and cosine waves are stored, differences between incoming waveform peak voltages are found, and amplitude values are compared with reference amplitude values to perform amplitude compensation. In this manner an amplitude compensation method for the absolute position detection apparatus, which provides high accuracy in response to changes in temperature and changes with time, is offered.

A fourth feature of the present invention involves an error compensation method for an absolute position detection apparatus wherein expected amplitude damping factors for an increased speed are stored, and amplitude compensation values are changed according to the current speed to perform an amplitude compensation. A fifth feature of the present invention provided an error compensation method for the absolute position detection apparatus wherein if an angle range is satisfied, the maximum and minimum values of the incoming sine and cosine waves and the instantaneous speed are stored, differences between incoming waveform peak voltages are found, and amplitude damping factors dependent on rotary speed are operated on from a relationship between amplitude values and the speed to find compensation values to perform amplitude compensation. With this approach, an amplitude compensation method for the absolute position detection apparatus, which can perform precise amplitude compensations up to high-speed rotation and further has high performance, can be achieved.

A sixth feature of the present invention achieves an error compensation method for the absolute position detection apparatus wherein if a current speed range or angle and speed ranges are satisfied, the maximum and minimum values of incoming sine and cosine waves are stored, the center values of incoming waveform peak voltages are found, and shift values from reference values are subtracted as offset values to perform an offset compensation. Accordingly, if the current speed range or the angle and speed ranges are satisfied, amplitude R=sin2θ+cos2θ (provided that θ is an angle) is stored, amplitude R0 at 0° is compared with amplitude R180 at 180° which is 180° out of phase therewith, amplitude R90 at 90° is compared with amplitude R270 at 270°, and offset values are found to render both amplitudes R equal to perform an offset compensation. In this manner an offset compensation method for the absolute position detection apparatus, which is high in accuracy and reliability, can be achieved.

A seventh feature of the present invention achieves an error compensation method for the absolute position detection apparatus wherein if a current speed range or angle and speed ranges are satisfied, the maximum and minimum values of incoming sine and cosine waves are stored, differences between incoming waveform peak voltages are found, and amplitude values are compared with reference amplitude values to perform an amplitude compensation. Accordingly, if the current speed range or the angle and speed ranges are satisfied, amplitude R=sin2θ+cos2θ (provided that θ is an angle) is stored, and amplitude compensation values at which amplitude R0 at 0° and amplitude R180 at 180° made equal by the offset compensation are equal to the reference amplitude RI and amplitude R90 at 90° and amplitude R270 at 270° are equal to the same are found sequentially to perform amplitude compensation. In this manner, an offset compensation method for the absolute position detection apparatus, which is high in accuracy and reliability, is achieved.

An eighth feature of the present invention involves an absolute position detection apparatus which further comprises an arithmetic unit for sequentially finding a waveform 90° out of phase with the other waveform from information on the phase shift angle of the sine wave and cosine wave preset in memory, thereby achieving a high-accuracy, highly reliable absolute position detection apparatus which produces less angle detection errors due to phase errors.

A ninth feature of the present invention provides an error compensation method for an absolute position detection apparatus in which amplitude-compensated amplitude R 45° out of phase with a reference axis is stored as the amplitude R, amplitude R45 at said 45° is compared with amplitude R225 at 225°, amplitude R135 at 135° is compared with amplitude R315 at 315°, and phase compensation values are changed to render both equal to perform a phase compensation. In this manner, if the current speed range or the angle and speed ranges are satisfied, the amplitude-compensated amplitude R 45° out of phase with the axis is stored, amplitude R45 at said 45° is compared with amplitude R225 at 225°, amplitude R135 at 135° is compared with amplitude R315 at 315°, and the phase compensation values are changed to render both equal to perform the phase compensation. Further the ninth feature is used with the sixth and seventh features, thereby offering a simple, high-accuracy and highly reliable phase compensation method for the absolute position detection apparatus which can perform the offset, amplitude and phase compensations automatically and completely.

A tenth feature of the present invention involves an error compensation method for the absolute position detection apparatus in which higher-frequency sine and cosine waves are generated consecutively by arithmetic operation using the compensated sine and cosine waves. This tenth feature can be used with any of the second to seventh and ninth features of the invention, thereby offering a further higher-accuracy error compensation method for the absolute position detection apparatus which can achieve a much higher resolution.

DESCRIPTION OF THE PREFERRED EMBODIMENTS

Embodiment 1

Figure 1:
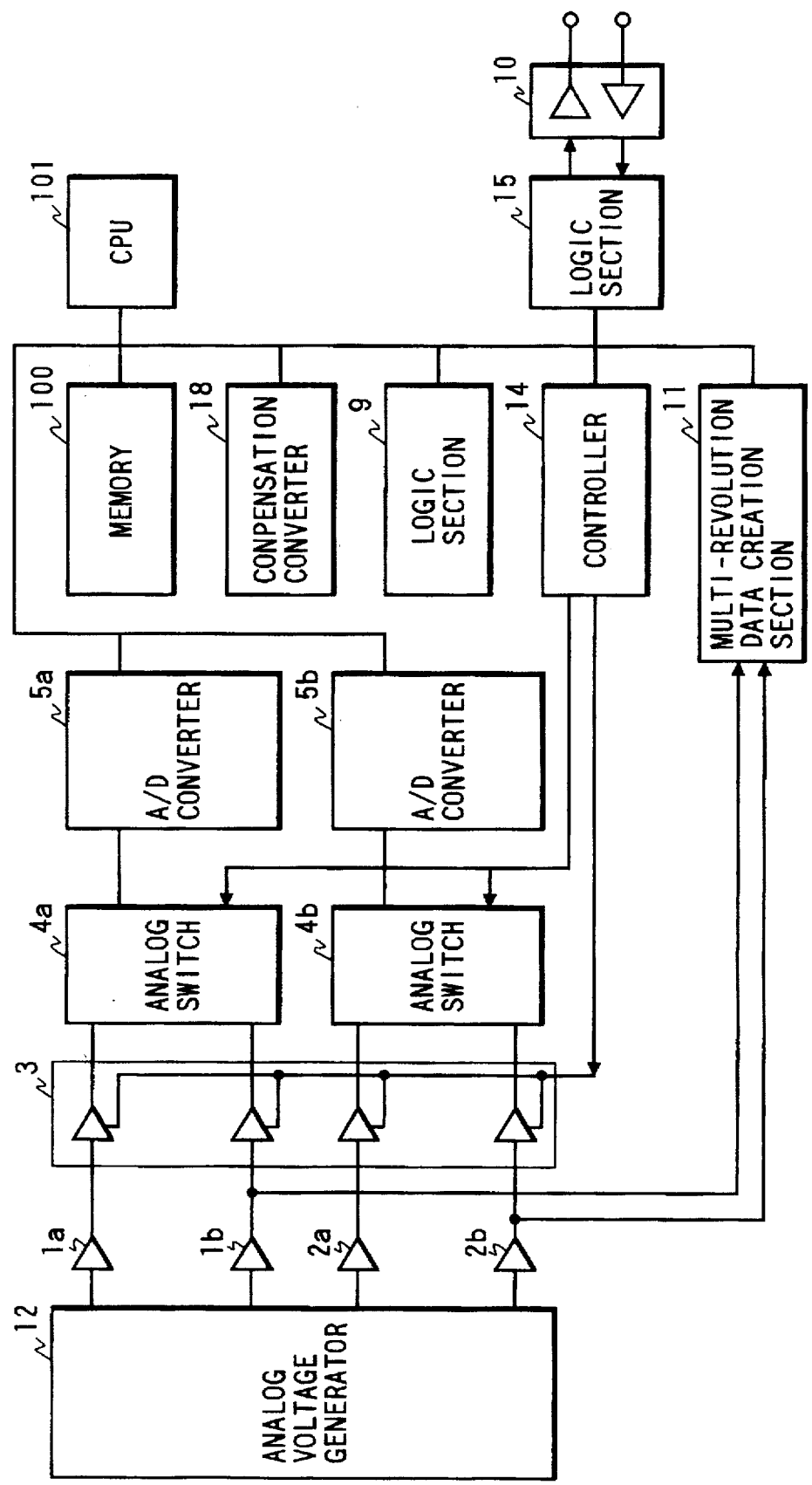
FIG. 1 is a block arrangement diagram of an absolute position detection apparatus according to a first embodiment of the present invention.
Figure 20:
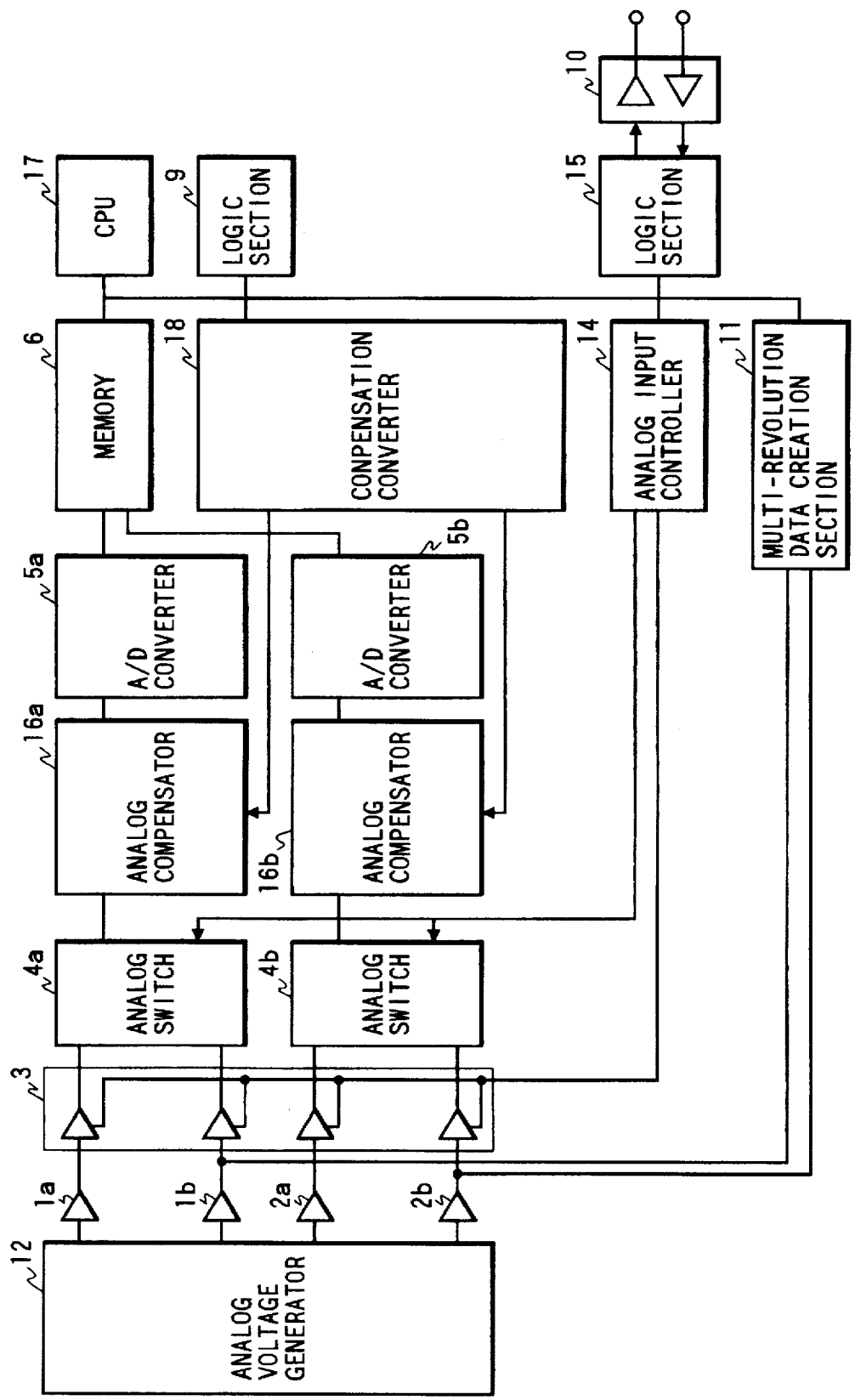
FIG. 20 is a block arrangement diagram of a conventional absolute position detection apparatus.
Figure 21:
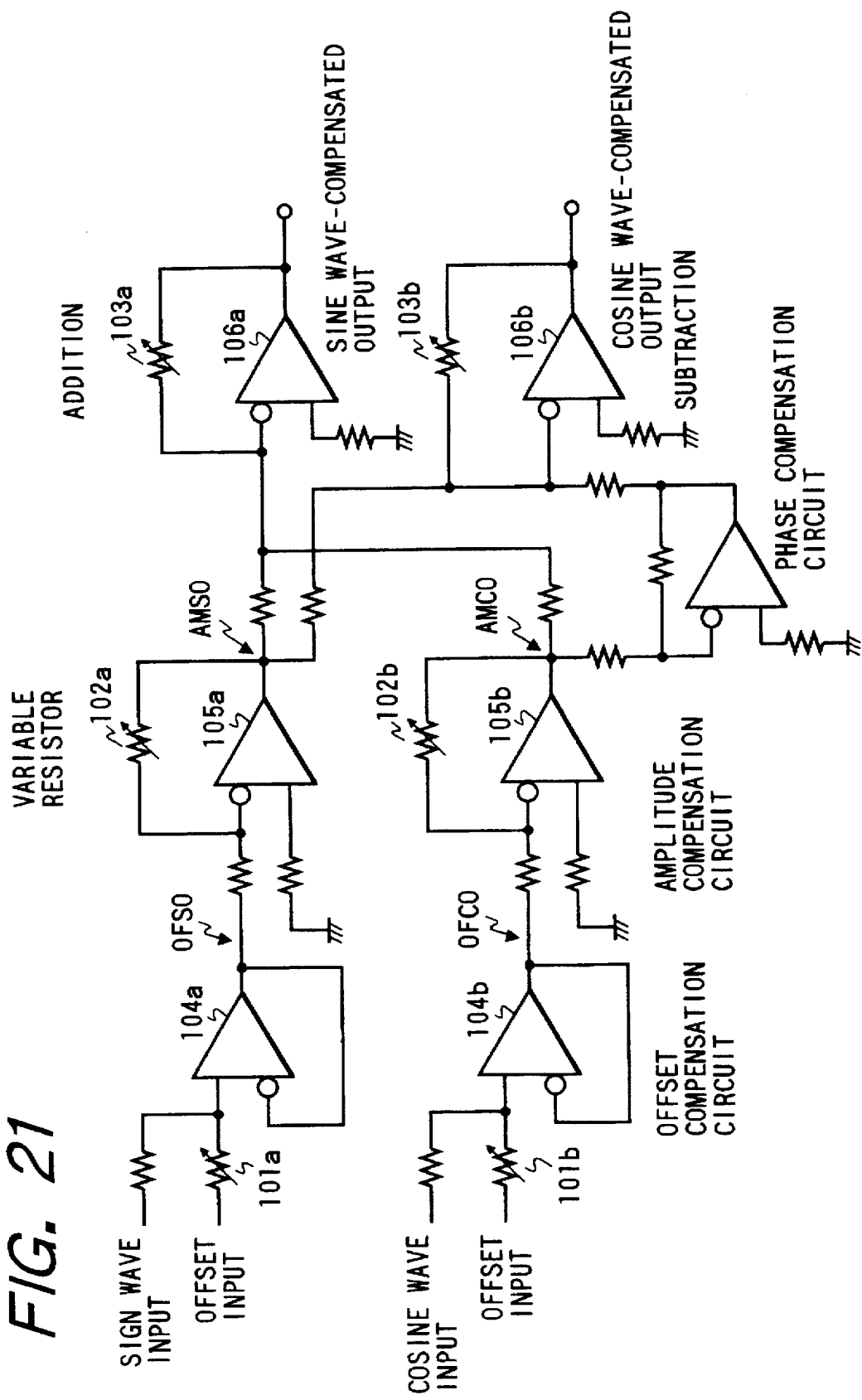
FIG. 21 is a diagram showing a specific example of analog compensators in the conventional absolute position detection apparatus.
Figure 22:
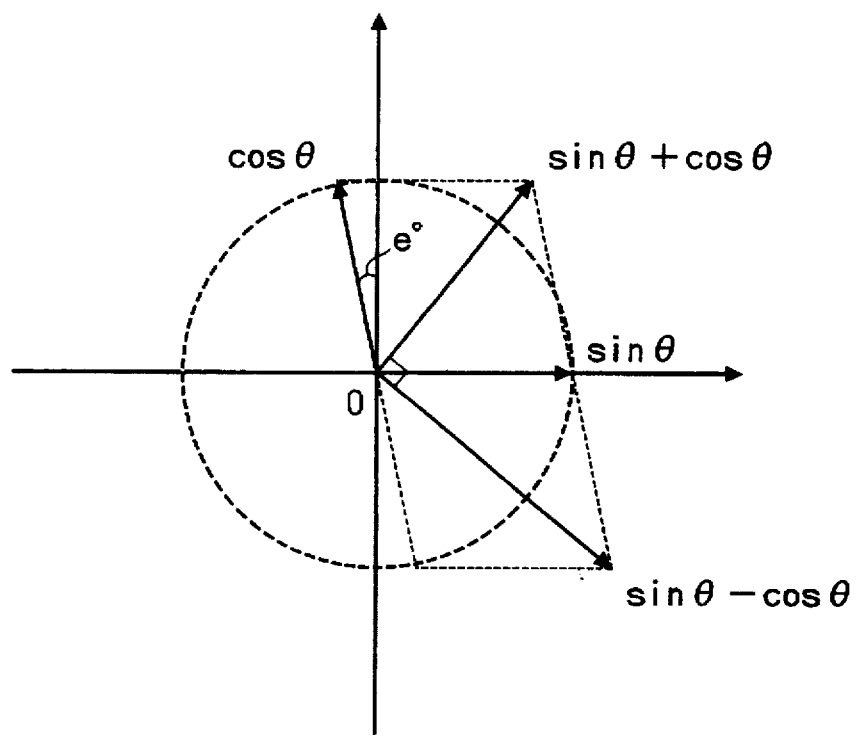
FIG. 22 is a diagram illustrating a phase compensation method between sine and cosine waves in the conventional absolute position detection apparatus.
Figure 23:
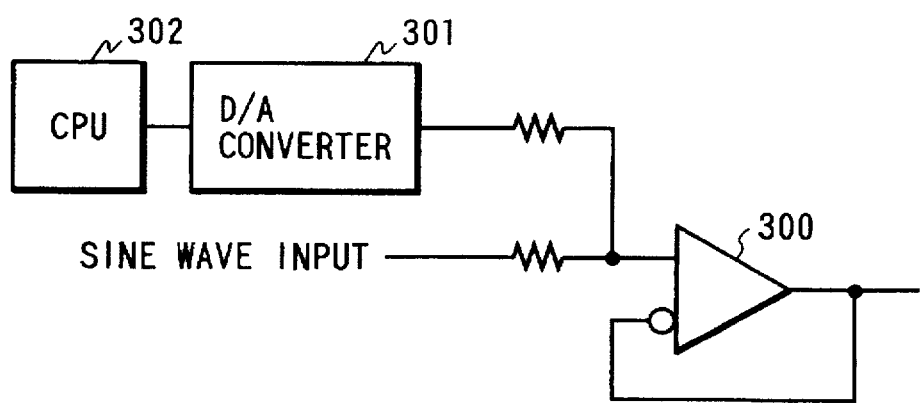
FIG. 23 is a diagram illustrating another example of the conventional absolute position detection apparatus.

An embodiment of the present invention will now be described with reference to the appended drawings. FIG. 1 is a block diagram of an absolute position detection apparatus embodying the present invention, and corresponds to FIG. 20 showing the conventional apparatus. It is to be understood that parts identical or corresponding to those in FIG. 20 are designated by identical reference characters and will not be described here.

In FIG. 1, the numeral 100 indicates memory stored with angle data corresponding to digital values converted by the analog-to-digital converters 5a, 5b, and 101 denotes a CPU which performs various compensations, e.g. offset, amplitude and phase compensations, using the resulting digital values and composes data output from the memory 100. It is to be understood that as in FIG. 20, line 200 and connections thereto represent block-to-block connections and the remaining lines denote signals transferred.

In the absolute position detection apparatus according to the embodiment of the present invention which is arranged as mentioned above, an N multiple of sine and cosine waves are entered into the analog input sections 1a, 2a during one revolution from the analog voltage generator 12 which generates an integral multiple of analog output voltages during a single revolution in an optical, magnetic or any other manner, and one cycle of sine and cosine waves are entered into the analog input sections 1b, 2b during a single revolution. These waves are triggered at the same time by the sampling hold device 3, the analog switches 4a, 4b are selected, and the waves are sequentially converted into digital values by the analog-to-digital converters 5a, 5b. Here, the two analog-to-digital converters 5a, 5b disposed in the present embodiment may be one or three or more.

Various compensations, such as offset, amplitude and phase compensations, described later are performed on the basis of the resultant digital values to create correct sine and cosine waves, and the correct phase tan−1(A) within one cycle is provided on the basis of said data. When there are a plurality of tracks (two tracks in the present embodiment), the data are composed to create an angle within one revolution, which is then output from the input/output section 10.

Embodiment 2

Figure 2A:
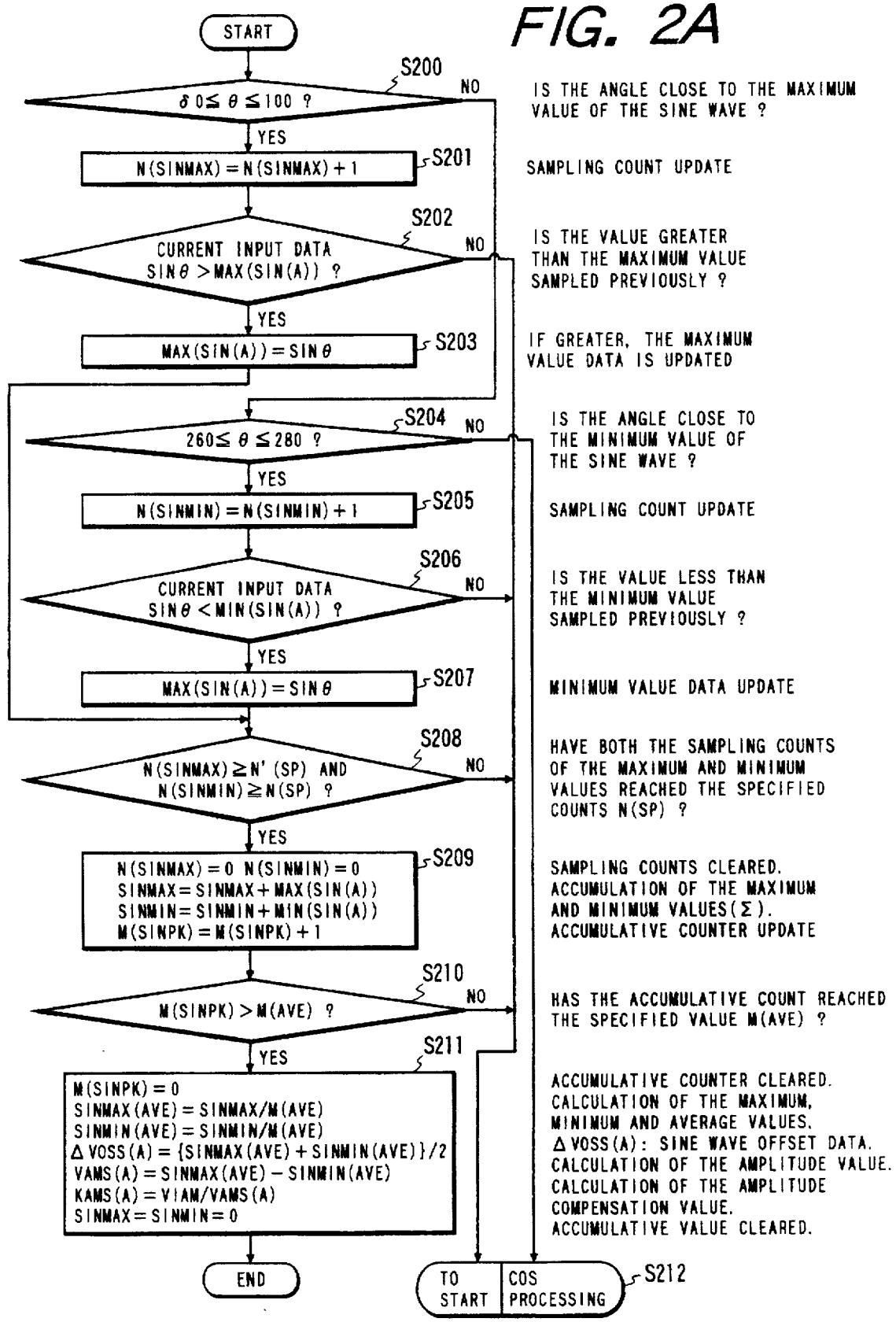
FIGS. 2A–2C comprise a flowchart used to describe a second and third embodiment of the present invention, illustrating compensation value detection algorithms.

Among said various compensation methods, the offset compensation will now be described as Embodiment 2. First, the compensation value detection algorithms of the offset and amplitude compensations will be described with reference to a flowchart in FIG. 2A. Assuming the data angle θ obtained by the current angle operation is 95° when certain speed and angle ranges have been defined (±10° range was defined in the example of the flowchart; the error of 2.5% is produced for 10° and that of 0.4% is produced for 5°) to find the maximum and minimum values of sine and cosine waves during operation (step 200), the maximum sine wave value sampling range is satisfied (step 201). Hence, the current sine wave input value SIN θ is compared with the previous maximum value stored in the memory MAX(SIN(A)) (step 202). If the current value data is larger, this value is updated (step 203).

It is to be noted that in steps 204–207 the minimum value is updated if the current value data is smaller.

This arithmetic may be repeated until the sampling counts N(SINMAX) and N(SINMIN) of both the maximum and minimum values reach the specified sampling counts N(SP) (step 208), at which time the maximum value MAX(SIN (A)) and minimum value MIN(SIN(A)) stored in the memory 100 are used to find the offset values ΔVOSS(A), ΔVOSC(A) by the following arithmetic (step 209):

ΔVOSS(A)={MAX(SIN(A))+MIN(SIN(A))}/2

When the values are peak-held as described above, however, they are influenced by noise, etc. To remove noise, the peak hold values MAX(SIN(A)) and MIN(SIN(A)) that have satisfied the sampling counts are accumulated M(AVE) times (step 210) and the offset compensation value ΔVOSS(A) for finding the average values SINMAX(AVE) and SINMIN(AVE) of said values is found by the following arithmetic (step 211):

ΔVOSS(A)={SINMAX(AVE))+SINMIN(AVE)}/2

It is to be noted that if the data angle θ does not satisfy the condition of 80≦θ≦100 in step 200, it is judged in step 204 whether or not the angle is proximate to the minimum sine wave value. If so, processing as described above is carried out. If not, cosine processing (COS processing) in step 212 is executed.

Figure 2B:
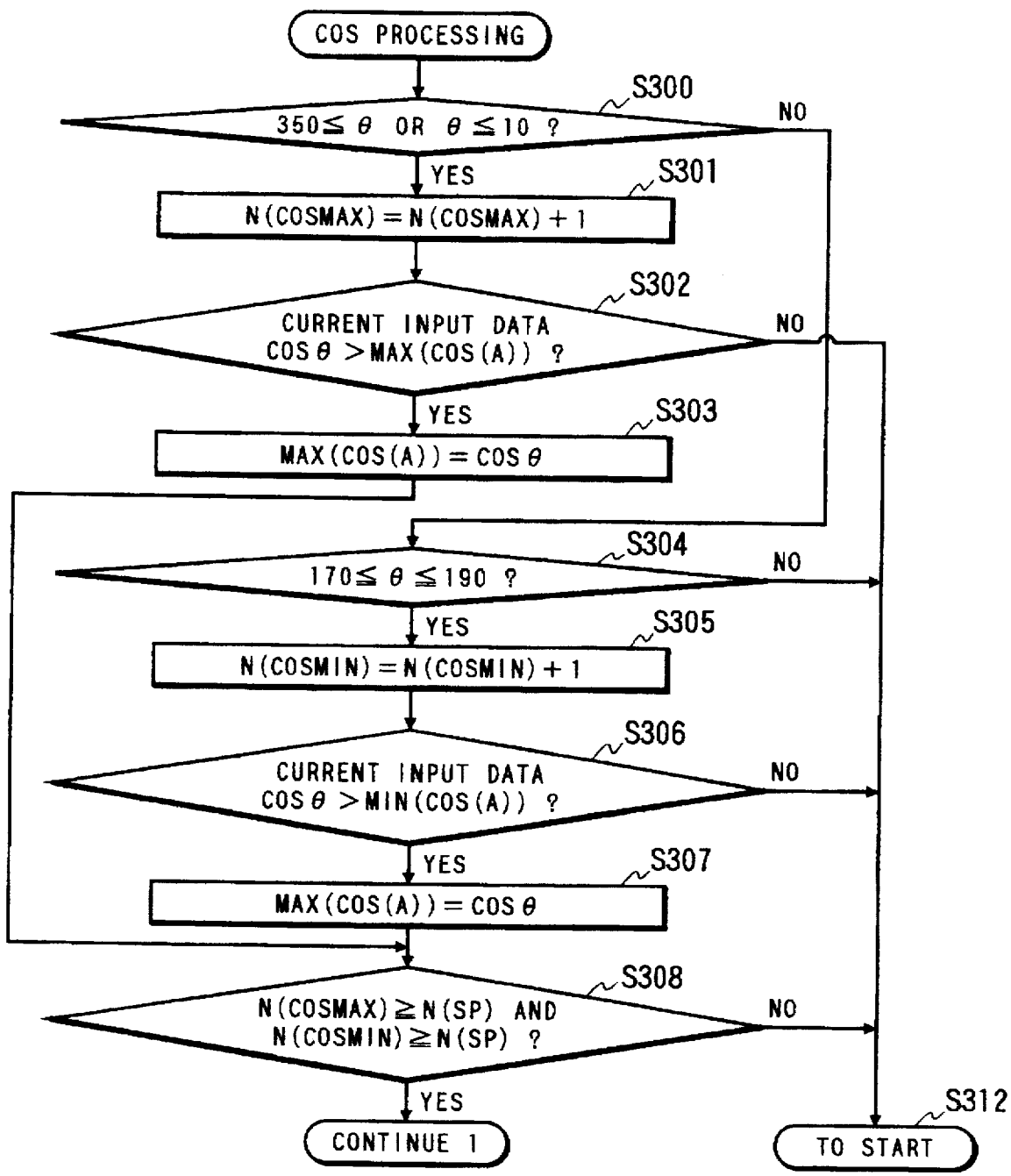
Figure 2C:
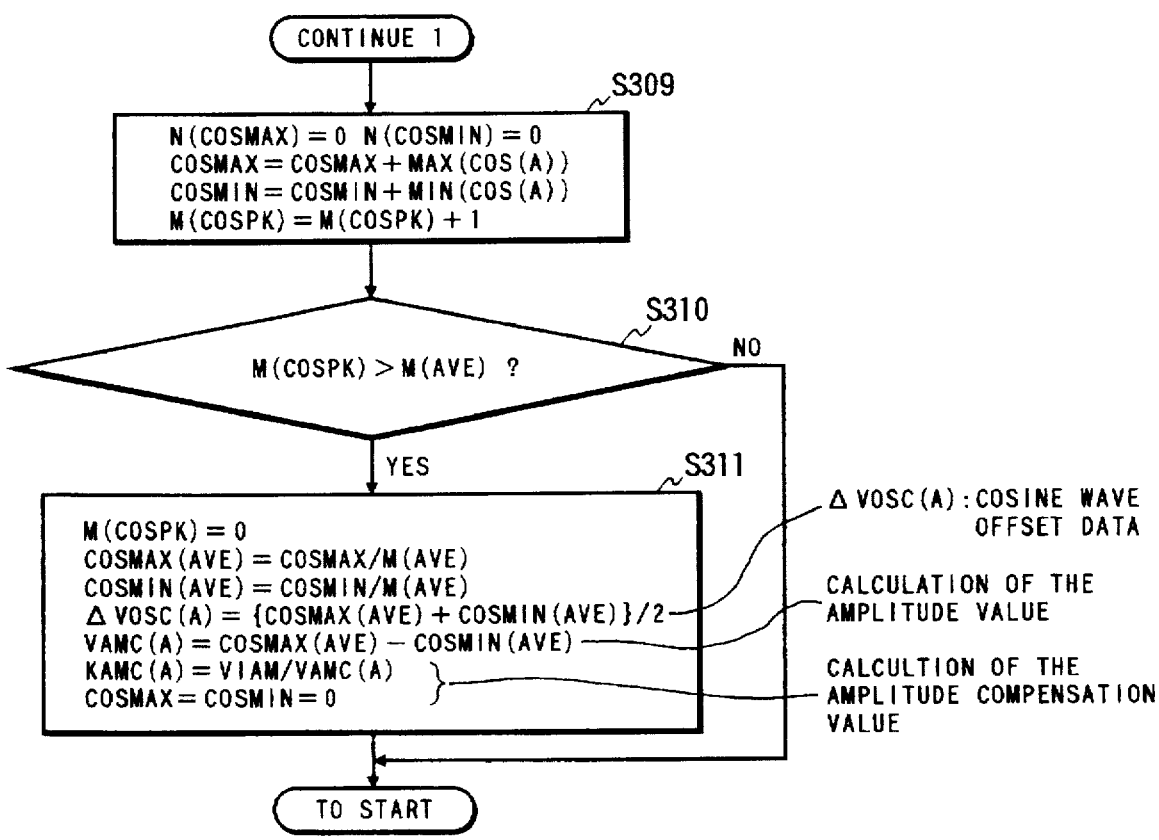

The cosine processing flow chart is illustrated in FIG. 2B. First, at step S300, a determination is made as to whether the data angle θ is greater than or equal to 350° or is less than or equal to 10°. If θ is within the recited range, the maximum cosine wave value sampling range is satisfied (step 301) and a comparison of the current cosine wave input value (See COSθ) is made with the previous maximum value stored in the memory MAX (COS) A)) (step 302). If the current value is larger, this value is updated (step 303). In a manner similar to the operation in FIG. 2A, in steps S304–S307, the minimum value is updated if the current value is smaller.

This processing is repeated until the sampling counts N (SINMAX) and N (COSMIN) of both the maximum and minimum values reaches the specified sampling counts N (SP) in step 308, at which time the maximum value MAX (SIN (A)) and a minimum value MIN (COS (A)) stored in the memory 100 are used to find the offset values ΔVOSS (A), ΔVOSC (A) by the following calculation, (step 309):

ΔVOSS (A)=[MAX (COS (A))+MIN (COS (A))]/2

When the values are peak-held as described above, in order to remove noise, the peak-hold values MAX (COS (A)) and MIN (COS (A)) that have satisfied the sampling counts are accumulated M (AVE) times (step 310) any offset compensation value Δ VOSS (A) for finding the average values COS MAX (AVE) and COS MIN (AVE) offset values is found by the following process (step 311):

ΔVOSS (A) =[COS MAX (AVE)+COS MIN (AVE)]/2

If the data angle θ does not satisfy the condition of 350≦θ≦ to 10 in step 300, it is judged in step 304 whether or not the angle is proximate to the minimum cosine wave value. If so, processing as described above is carried out; if not, processing returns to the start of the program.

There is also a simple averaging method without peak holding. For example, if the range is ±5°, there are almost no errors from the peak holding method. By subtracting this value per data sampling, offset-eliminated sine wave SIN (AOS) and cosine wave COS(AOS) are always provided.

SIN(AOS)=SIN(A)−ΔVOSS(A)

COS(AOS)=COS(A)−VOSC(A)

Embodiment 3

The use of amplitude compensation will now be described as Embodiment 3. The offset-removed sine wave and cosine wave data has the probability that their amplitude values are unbalanced. Since the amplitude values may also be too small, the sine and cosine waves are amplitude-compensated to the reference amplitude value VIAM, thereby eliminating the unbalance value. The data SINMAX and SINMIN as in the offset compensation are employed to find the amplitude value VAMSIN:

VAMS(A)=SINMAX−SINMIN (for the sine wave)

Then, the amplitude compensation values KAMS(A)= VIAM/VAMS(A) and KAMC(A)=VIAM/VAMC(A) are found and always multiplied by SIN(AOS) and COS(AOS), respectively, to render the sine wave and cosine wave equal in amplitude value VIAM:

SIN(AAM)=KAMS(A)*SIN(AOS)

COS(AAM)=KAMS(A)*COS(AOS)

Embodiment 4

Figure 3:
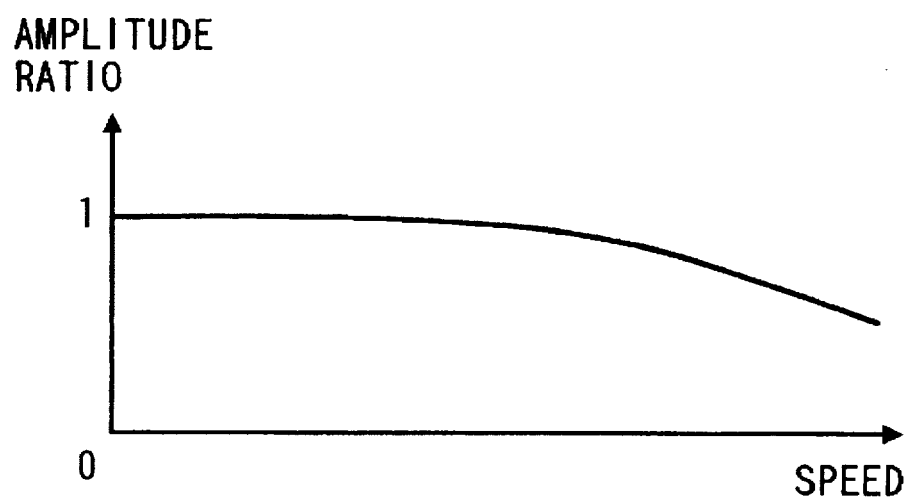
FIG. 3 is a diagram used to describe a fourth embodiment of the present invention, showing a relationship between a speed and an amplitude damping factor.
Figure 4:
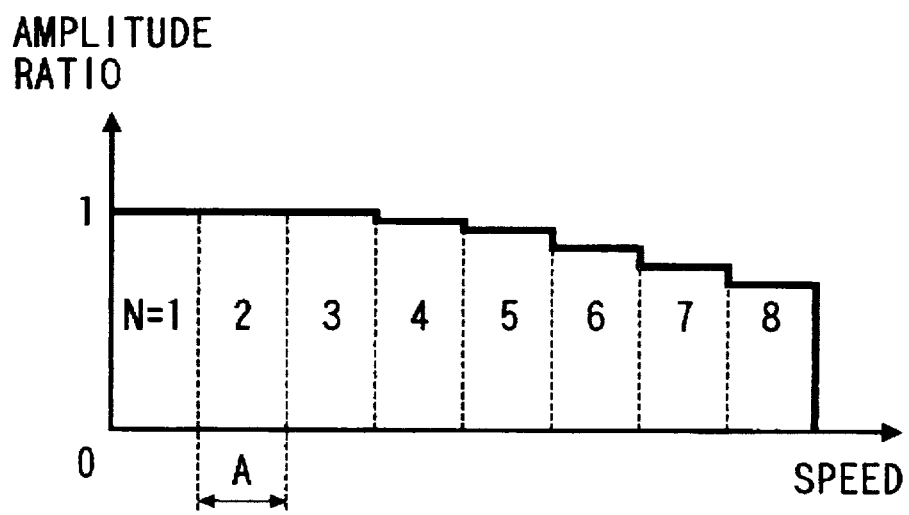
FIG. 4 is a diagram used to describe the fourth embodiment of the present invention, showing amplitude damping factors corresponding to eight speed ranges into which the speed range in FIG. 3 has been equally divided.

As the speed increases, the amplitudes of analog waves are damped. Hence, the amplitude compensation values must be changed according to the speed. Assuming that VAMS(A)(ω)=f(ω)VAMS(A), the amplitude value at each speed is measured and the relationship between the speed and amplitude damping factor as shown in FIG. 3 is stored in the nonvolatile memory 9. The contents stored may be an f(ω) arithmetic expression found by measurement or the data of speed divided to some degree. For example, FIG. 4 shows amplitude damping factors corresponding to eight speed ranges into which the speed range in FIG. 3 has been divided.

The speed is found according to the variation of a within-one-revolution phase counter finally found. Now, supposing that the speed is ω0, the following value is defined as the amplitude compensation value for the amplitude compensation performed in consideration the speed:

KAMS(A)=VIAM(A)/(VAMS(A)f(ω0))

(This expression also applies to COS)

Figure 5:
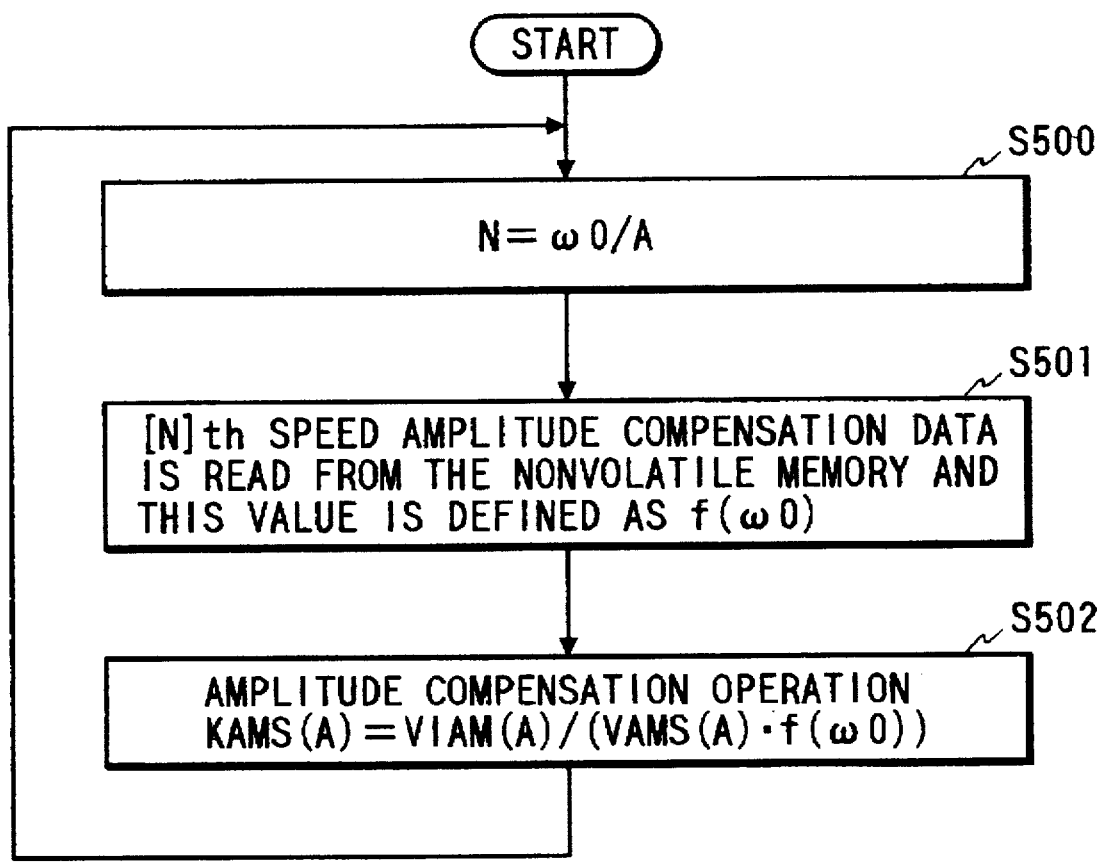
FIG. 5 is a software flowchart illustrating the calculation of the amplitude and compensation value KAMS(A) as performed in the fourth embodiment of the present invention.

FIG. 5 shows a software flowchart where the speed has been divided. The group N to which the current speed ω0 belongs is calculated (step 500).

The speed-damping factor f(N) stored in the non-volatile memory 9 is then read (step 501). This value is defined as f(ω0). Then, the same arithmetic operation using the above expression is performed to find the amplitude compensation value KAMS(A) (step 502). After the calculation, the processing returns to step 500.

Embodiment 5

Embodiment 5 will now be described. When the speed judgement is removed from the algorithms for sampling the maximum and minimum values of the analog waves, a speed-dependent amplitude damping function can be sampled as data. Then, f(ω) can be found on the basis of this data to perform an automatic speed amplitude compensation.

Figure 6:
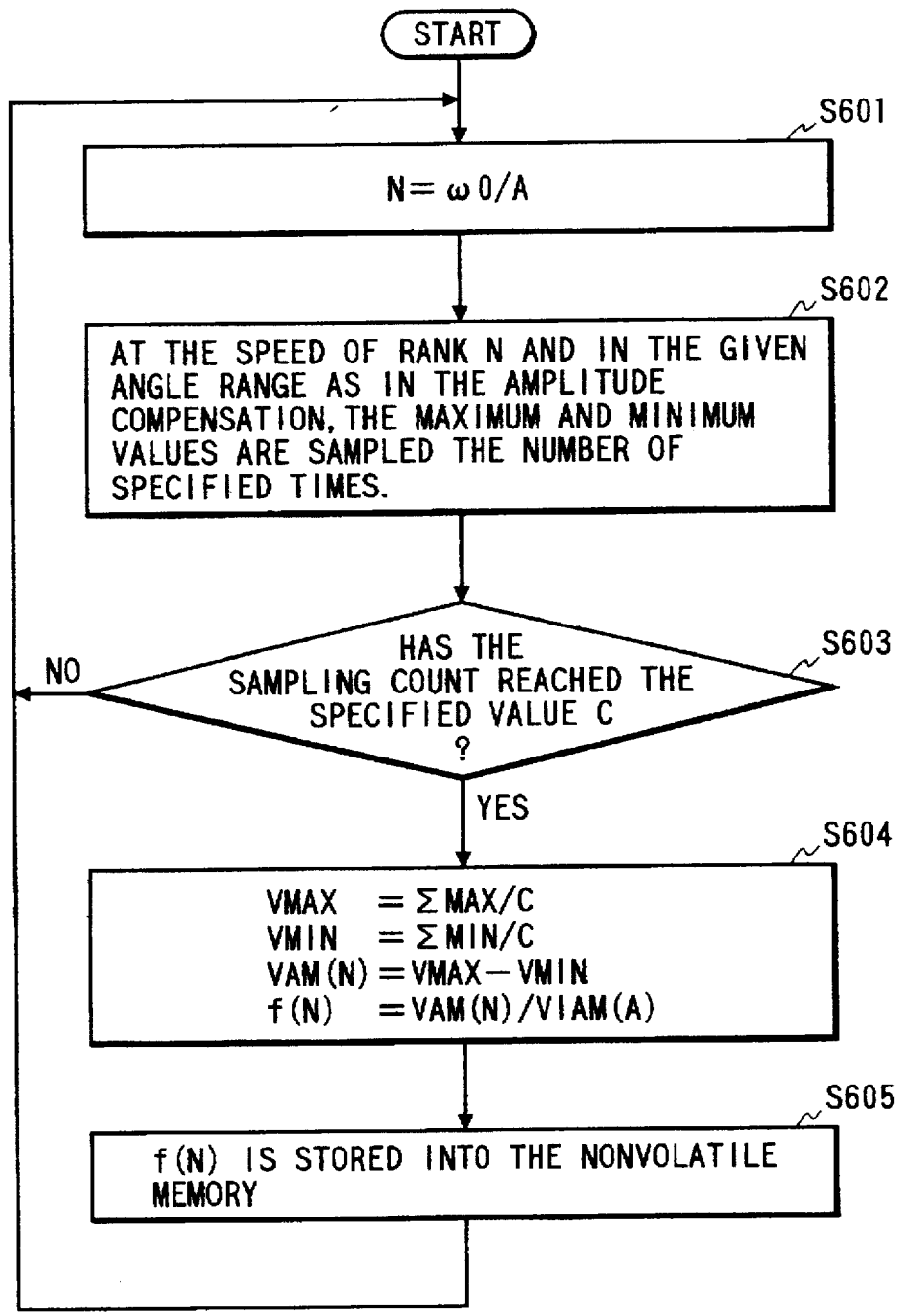
FIG. 6 is a software flowchart illustrating the calculation of the speed damping factor as performed in the fifth embodiment of the present invention.

A software flowchart for automatically finding the speed damping factor f(ω0) is shown in FIG. 6. First, the current speed range N is found (step 601). Then, data in that speed range is sampled the specified number of times as in the program for amplitude compensation (step 602). The data in the speed range that has reached max and min values the specified number of times (step 603) is stored into the nonvolatile memory 9 (step 604).

More specifically, the accumulation of maximum amplitude values ΣMAX is divided by the sampling count C to find the average value VMAX, the minimum value is found similarly, and their difference VMAX(N) is found. Then, the ratio of the difference to the reference amplitude width at the speed without amplitude damping VIAM(A) is taken; this is defined as f(N) (step 604), and is stored into the nonvolatile memory 9 (step 605). Since f(N) is updated during operation, the speed amplitude compensation is performed automatically.

Embodiment 6

According to Embodiment 6, which may be understood with reference to the flow chart in FIG. 7, the offset compensation may also be performed in the following removing method. From the offset-compensated data (provided that the initial values of the offset compensation values ΔVOSS(A) and ΔVOSC(A) are 0) SIN(AOF) and COS(AOF), the value of R=SIN$^2$(AOF)+COS$^2$(AOF) is always operated on and this data is stored in the memory. The condition at this time is defined as the proximity to the axes (e.g. ±10°) as in Embodiment 2. This data is sampled during operation to provide the MAX value or average value of a given count. R90 (90±10° data) is compared with R270 (270±10° data), and the offset compensation value ΔVOSS (A) is changed according to a difference therebetween (steps 701 to 712). For instance, if R90<R270, the operation of increasing ΔVOSS(A) is repeated until R90 is equal to R270 (for ΔVOSC(A), R0 and R180 are used to perform the same operation).

Figure 7:
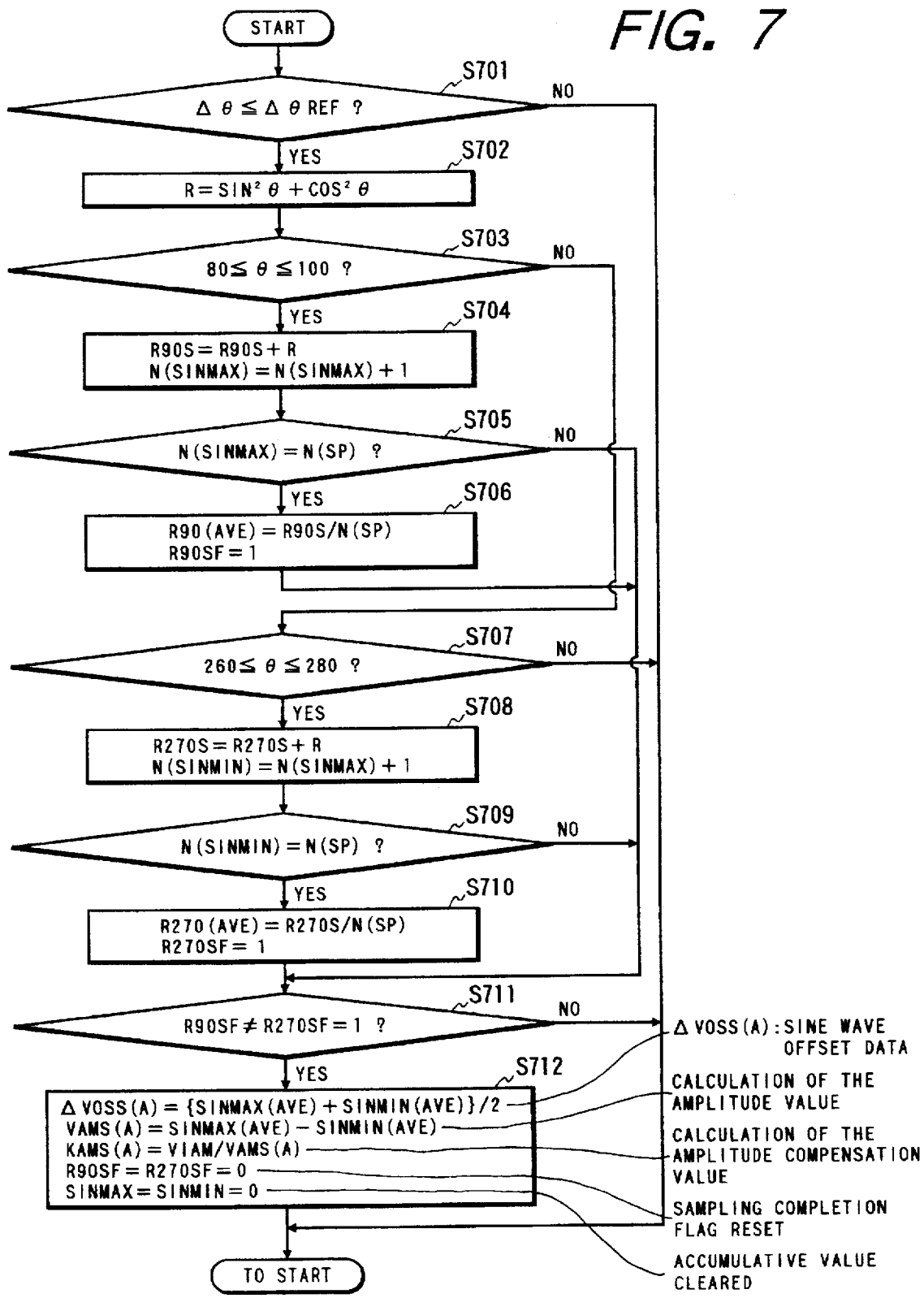
FIG. 7 is a software flowchart illustrating the offset compensation process as performed in the sixth embodiment of the present invention.

Referring to FIG. 7, a determination is made as to whether the change in angle θ is less than or equal to a predetermined reference value Δ θ REF. If greater, the processing proceeds to a start condition, but if Δ θ is less than the reference value, a value R is calculated at step 702 and a determination is made at step 703 as to whether Δ is in the range of 80° to 100°. If not, processing proceeds to step 707 where a determination is made as to whether θ is between 260° and 280°. If not, processing proceeds to START, but if within the range, adjustment is made to R270 in step 708. Following that step, a determination is made in step S709 as to whether N (SIN MIN)=N (SP) and, if so, further adjustment is made to R270 (AVE), making it equal to R270 S/N (SP) in step S710.

If as a result of the determination in step S703 that Δ is within the range 80°–100°, R90S is adjusted in step S704 and the value in (SIN MAX) is checked for its relationship to in (SP) in step 705. If equal, R90 AVE is equal to R90S/N (SP) in step 706, and processing proceeds to step 711. Similarly, if result of the determination in step S705 that there is no equality, processing also proceeds to S711. The output of step S710 normally is output to step S711 where a determination is made as to whether R90SF=R270SF. If not, processing proceeds to start but if there is an equality, ΔVOSS (A) is increased until R90 is equal to R270.

Embodiment 7

A method of performing an amplitude compensation using the data found in Embodiment 6 will now be described as Embodiment 7. The data converged on RS=R90=R270 by the offset compensation is compared with the reference R1, and the amplitude compensation value VAMS(A) is operated on sequentially by the following expression:

VAMS(A)=√(R1/RS)

For COS, the data of RC=R0=R180 is employed in a similar manner:

$$VAMC(A)=\sqrt{(R1/RC)}$$

When the $\sqrt{}$ operation is impossible or requires long processing time, a method of changing the values of VAMS (A) and VAMC(A) by gradual integration is also available as another embodiment.

Embodiment 8

Embodiment 8 will now be described. Waveform data which has been operated on for amplitude compensation may not be precisely 90° in phase difference. Now supposing that SIN(AAM) is shifted 90+° from COS(AAM), the sine wave SIN(APM) precisely 90° out of phase with COS(AAM) has the following relationship:

$$SIN\ (AAM)=SIN(APH)COS(\alpha)+SIN(\alpha)COS(AAM)$$

Accordingly, the phase-compensated data SIN(APH) is found by the following arithmetic:

$$SIN(APH)=\{SIN(AAM)+COS(AAM)SIN(\alpha)\}/COS(\alpha)$$

It is to be understood that the values of $SIN(\alpha)$ and $COS(\alpha)$ are stored beforehand in the memory.

It is to be noted that a technique is disclosed in Japanese Laid-Open Patent Publication No. SHO61-149822 as a prior art for performing a phase error compensation between sine and cosine waves. This technique, wherein a phase compensation is carried out on the basis of compensation information stored beforehand in a storage device, is different from the present embodiment in that the phase compensation is performed by an approximate solution method.

Embodiment 9

An automatic phase compensation will now be described as Embodiment 9. $R=SIN^2(AAM)+COS^2(AAM)$ is stored with speed and angle limitations, provided that there are shifts of 45° with respect to the axes. Assuming that the offset and amplitude compensations have been carried out, R45 is approximately equal to R225 and R135 approximates R315. Hence, their average values are taken and defined as R1 and R2. In the compensation, $SIN(\alpha)$ and $COS(\alpha)$ are operated on by changing $\alpha$ to render R1 and R2 equal, and these values are used to perform the phase compensation.

Figure 8:
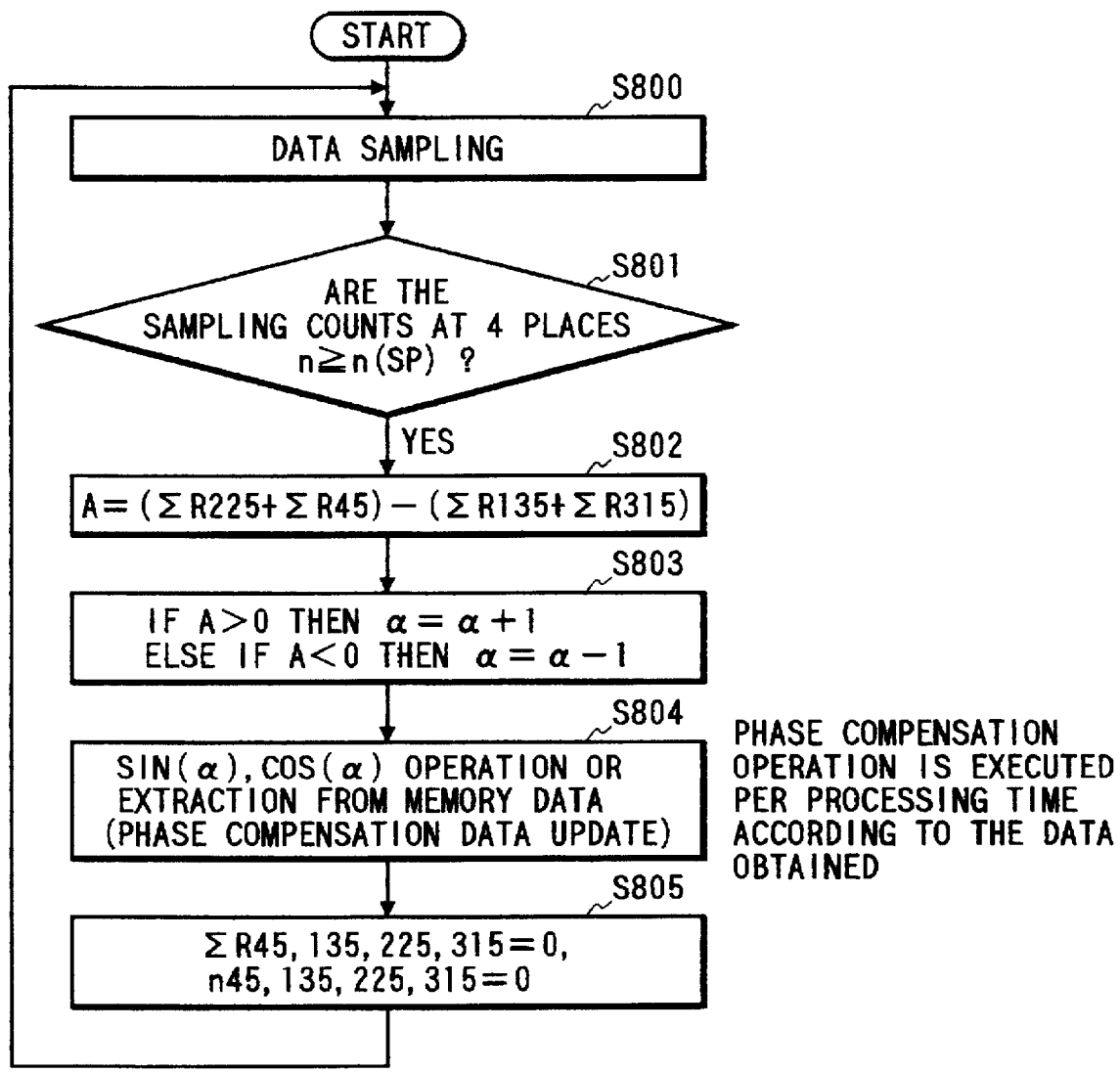
FIG. 8 is a flowchart illustrating the automatic phase compensation process as performed in the ninth embodiment of the present invention.
Figure 9:
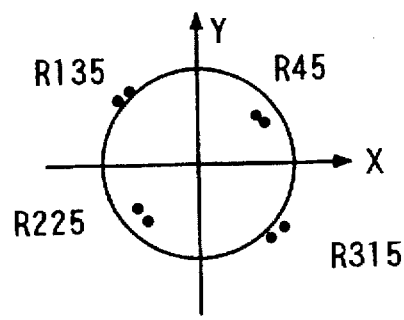
FIG. 9 is a diagram illustrating the results of a data sampling method consisting of data sampled in the four angle ranges 45° out of phase with the axis consistent with the method described in the ninth embodiment of the present invention.

FIG. 8 shows an automatic phase compensation flowchart. Data basically sampled is the square sum of the amplitude-compensated sine and cosine waves. As data is sampled (step 800) in the four angle ranges 45° out of phase with the axes, such a result as shown in FIG. 9 is obtained (black dots represent sampling points; this example assumes a waveform in which the sine wave lags).

In FIG. 8, first there is check (as in the offset and amplitude compensations) as to whether the sampling counts in the four regions have reached the specified counts (step 801). In this regard, each angle data is accumulated n(SP) times and is not incremented when that count is exceeded. The algorithms during the sampling, which are identical to those in the offset and amplitude compensations, have been omitted here but would be apparent to one of ordinary skill.

Out of the accumulative values in the four regions, the sum of 135 degrees and 315 degrees is subtracted from the sum of 225 degrees and 45 degrees and the result is defined as the value A (step 802). If the value A is positive, the phase compensation angle $\alpha$ is incremented by 1 because it is small. If the value A is negative, the phase compensation angle $\alpha$ is decremented by 1 because it is large. As a matter of course, if A=0, $\alpha$ is left as it is (step 803). From the value of $\alpha$ found, the phase compensating data $SIN(\alpha)$ and $COS(\alpha)$ are found (data may be either be operated on or extracted from the table on the memory) (step 804). The current accumulative data and sampling counts are cleared and sampling is conducted again (step 805). It is to be understood that after the phase compensation, the sine wave SIN(APH) is calculated as described above.

Embodiment 10

According to Embodiment 10, there is a compensation that completes the creation of error-free sine and cosine waves. These two pieces of phase compensation data are used to create higher-frequency sine and cosine waves. To provide frequency eight times higher, for example, an arithmetic process is consecutively performed with the following expression in order to enhance resolution:

$SIN2\theta=2SIN\theta.COS\theta$
$COS2\theta=1-2COS2\theta$
$SIN4\theta=2SIN2\theta.COS\theta$
$COS4\theta=1-2COS^22\theta$
$SIN8\theta=2SIN4\theta.COS4\theta$
$COS8\theta=1-2COS^24\theta$ $Tan^{-1}(A)$ is then operated on from the resulting data (to reduce the operation time, the $tan^{-1}$ data may be output with the SIN and COS data arranged on the memory table as an address). Supposing that the data obtained are both N bits long, low-order data are matched to match the data of eight times the frequency with that of one time the frequency, thereby providing the resolution of N+3 bits long. The data of one cycle in one revolution are matched in a similar manner to calculate the phase angle within one revolution.

The absolute position detection apparatus outputs the accumulative revolution count (N) and within-one-revolution phase count (P) to the outside every time a request is given, thereby terminating the sequence of operations.

Embodiment 11

Figure 10:
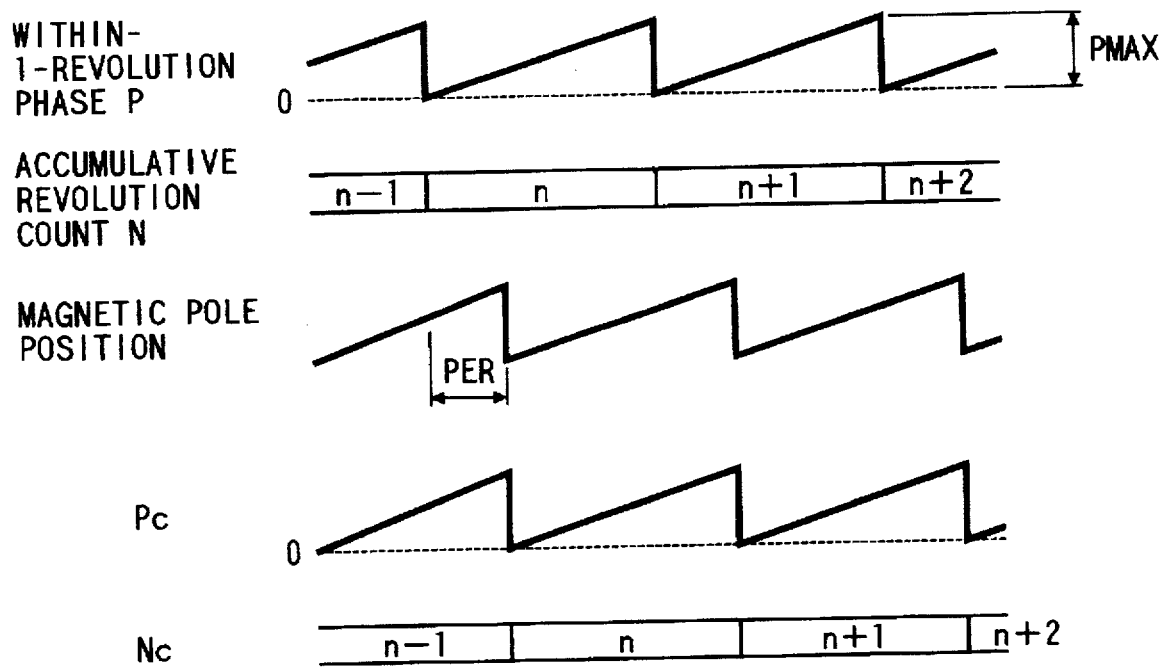
FIG. 10 is a compensation block diagram depicting the magnetic pole position detection compensation data as sequentially calculated in the eleventh embodiment of the present invention.

Embodiment 11 will now be described. When the absolute position detection apparatus is connected with a synchronous motor (AC servo motor), the magnetic pole positions of the motor are generally obtained from the within-one-revolution phase information of the detection apparatus. In this case, the reference positions of the motor and the detection apparatus installed thereto must be matched with each other. In this embodiment, when the detection apparatus, fitted adequately without its position being matched with that of the motor, has a phase difference (+PER) from the reference position of the motor, this error is stored in the memory beforehand and the magnetic pole position detection-compensated data Pc and Nc are found sequentially, as seen in FIG. 10 which illustrates the relevant compensation waveforms.

Figure 11:
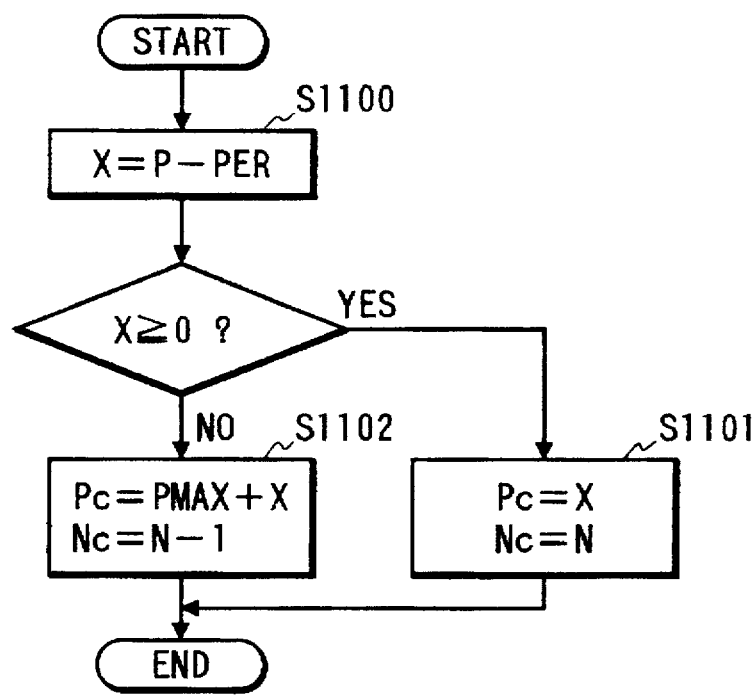
FIG. 11 is an arithmetic operation flowchart illustrating the sequential determination of the magnetic pole position detection-compensated data Pc and Nc as calculated in the eleventh embodiment of the present invention.

FIG. 11 is an arithmetic flowchart pertinent to the embodiment.
Initially, a calculation X=P-PER (step 1000) is made When $X \geq 0$, it is assured that Pc=X and Nc=N (step 1001). When X<0, it is assured that Pc=PMAX+X and Nc=N-1 (step 1002), where PMAX is a maximum within-one-revolution phase value.

The compensated data Pc, Nc are always output to the outside.

Embodiment 12

Figure 12:
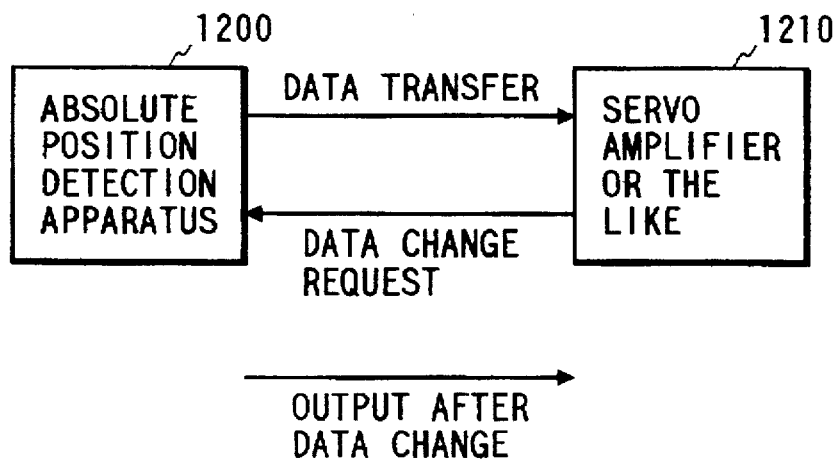
FIG. 12 is a conception diagram used to describe the reoperation on data by the absolute position detection apparatus at the request of the amplifier and subsequent transmission of data involved in the twelfth embodiment of the present invention.

The method of outputting the data will now be described as Embodiment 12. It is assured that data can be transferred between the absolute position detection apparatus 1200 and a device 1210 connected thereto (e.g. a servo amplifier, provided that the device may be integrated). In FIG. 12, the absolute position detection apparatus 1200 will re-operate on data at the request of the amplifier 1210 and subsequently transmit it.

Embodiment 13

Figure 13:
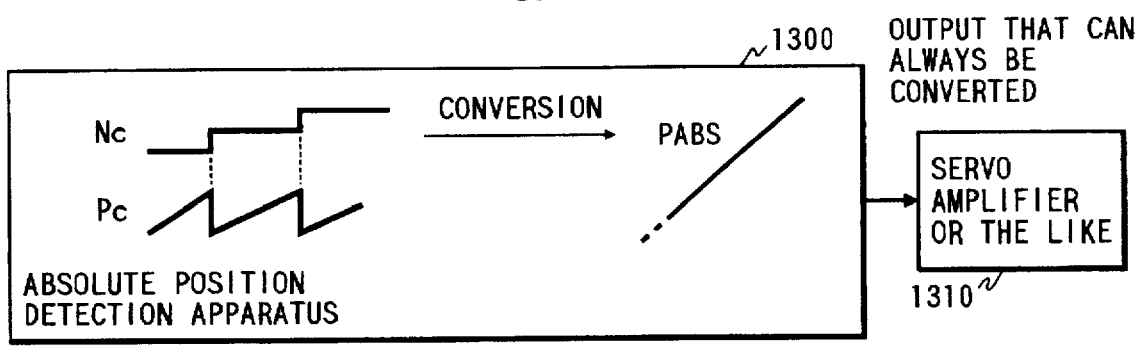
FIG. 13 is a conception diagram used to describe calculations performed and outputted on a pulse resolution basis of the within-one-revolution counter Pc as conducted in the thirteenth embodiment of the present invention.

Embodiment 13 will now be described. An ordinary absolute position detection apparatus 1300 outputs the cumulative revolution count Nc and within-one-revolution count Pc as different data (provided that the matching of the sampling timing is guaranteed). The servo amplifier 1310 which has received these data must compose the two data to create the absolute position. In this embodiment, the following arithmetic operation is always performed and the result is output on a pulse resolution basis of the within-one-revolution counter Pc as shown in FIG. 13, whereby the cumulative revolution count Nc and within-one-revolution count Pc need not be operated on by the servo amplifier 1310:

PABS=NcPMAX+Pc

Embodiment 14

Figure 14:
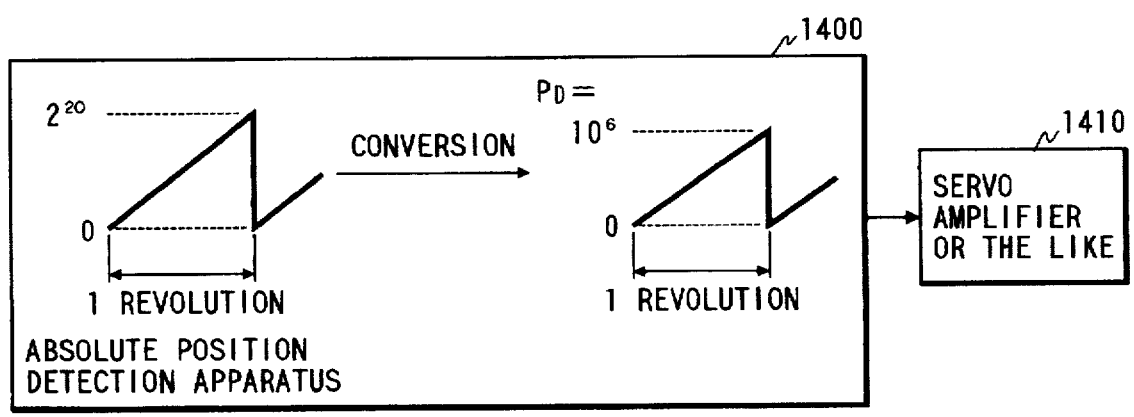
FIG. 14 is a conception diagram used to describe the data conversion conducted by the absolute position detecting apparatus and subsequent transmission to the servo amp as provided for in the fourteenth embodiment of the present invention.

Embodiment 14 will now be described. The data of the analog-to-digital converter and the arithmetic operation performed by the CPU are generally on a binary basis. Accordingly the number of divisions within one revolution is also 2n. Meanwhile, mechanical systems and control units are on a decimal basis. Hence, the servo amplifier that has received data must convert it from binary to decimal. In this embodiment, this data is output after it is converted by the absolute position detecting apparatus 1400 into the nearest-to-zero decimal value Kp (provided that Kp is basically less than 2n) and provided to the servo amp 1410. For instance, when the number of divisions within one revolution is 220 pulses as shown in FIG. 14, the following arithmetic operation is always performed to find and output PD as 1,000,000 pulses, whereby the conversion need not be performed in the servo amplifier:

PD=Kpc(K=106/220)

The then value of K is stored into the memory. At this time, the absolute value data created in Embodiment 13 can also be converted in an identical manner.

Embodiment 15

Figure 15:
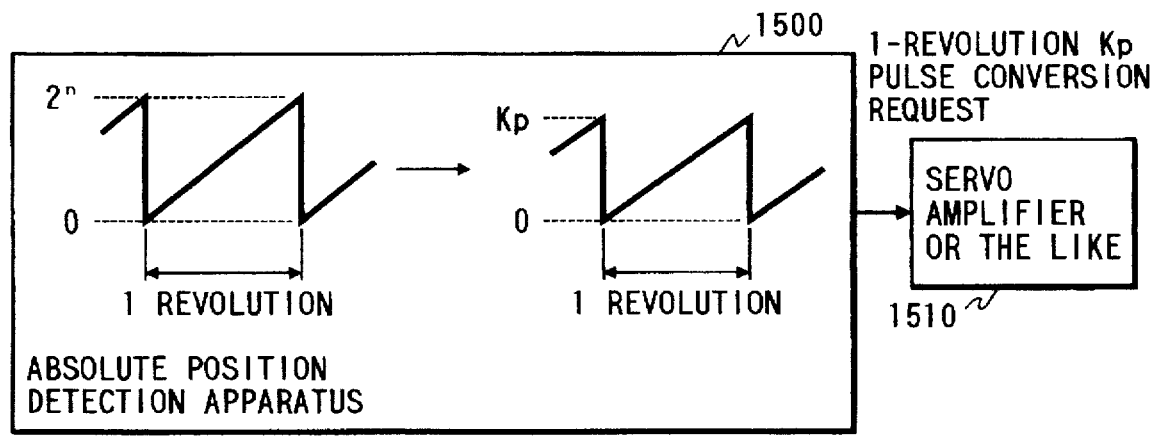
FIG. 15 is a conception diagram used to describe the absolute value data conversion as conducted in a fifteenth embodiment of the present invention.

In Embodiment 15, any number of divisions within one revolution Kp (or K) is further transferred from a device connected. As shown in FIG. 15, the absolute position detection apparatus 1500 stores K=Kp/2n in the memory, performs arithmetic operation as in Embodiment 14, and outputs data to the servo amp 1510. In this case, the absolute value data created in Embodiment 13 can also be converted in an identical manner.

Embodiment 16

In Embodiment 16, information on the gear ratio M between motor and machine end (it is assumed that M revolutions of the motor rotate the ballscrew one turn) and the minimum command unit of the ballscrew pitch (L) are transferred from the servo amplifier 1610 and the absolute position detection apparatus 1600 outputs that data after converting it into the resolution of the maximum integral fraction of the command unit. For example, if it is assumed that the minimum command unit is 0.01 µm, M is 2, and L is 10 mm, one motor revolution of 5 mm is converted into 500000 divisions. If it is supposed that the number of divisions within one revolution is 220, the data is converted into 106 divisions and then output since the maximum integer is 2.

Embodiment 17

Figure 16:
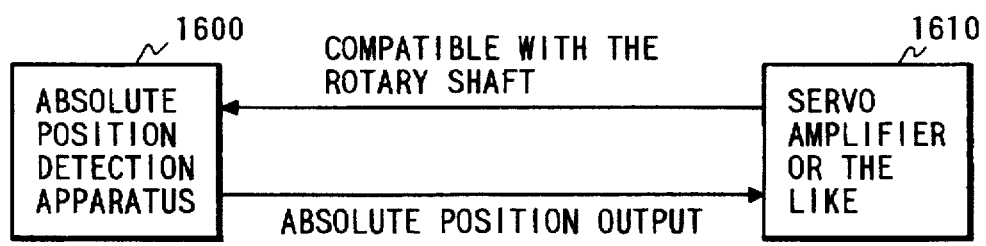
FIG. 16 is a conception diagram used to describe the resetting of output data per M motor revolutions as described in a seventeenth embodiment of the present invention.

In FIG. 16 showing the concept of Embodiment 17, the absolute position detection apparatus 1600 fitted to a rotary shaft is designed to reset output data per machine end 360°. Data conversion is performed to reset the data per M motor revolutions according to the gear ratio information M in Embodiment 16. In this case, arithmetic operation can be performed more easily by using PABS which is the composition result of the accumulative revolution count and within-one-revolution phase count. The absolute position detection apparatus 1600 sequentially outputs the remainder PROT after operating on it by dividing the value by the product of M and within-one-revolution division count 2n, according to the following equation:

PROT=remainder (PABS/(M2n))

Embodiment 18

Figure 17:
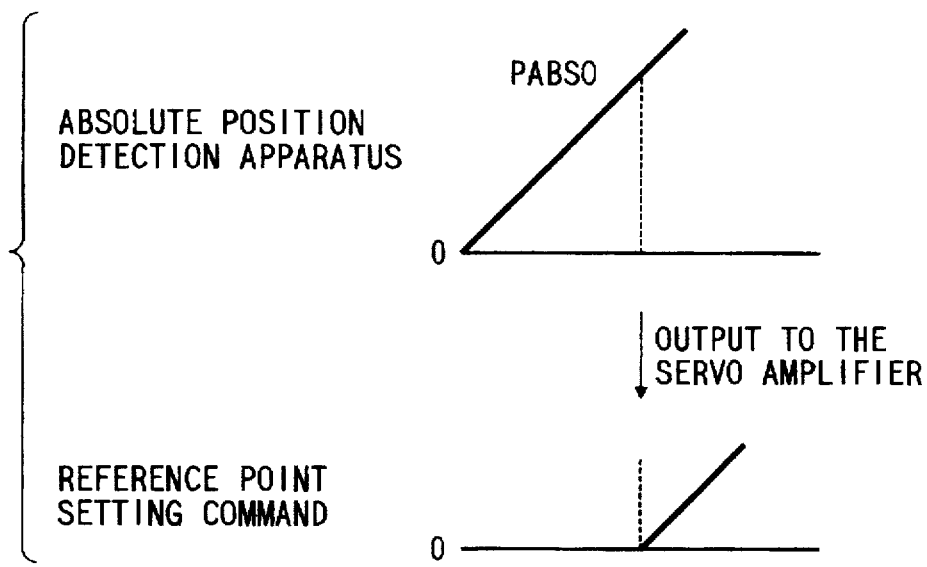
FIG. 17 is a conception diagram used to describe the definition of an absolute position point as the reference point and subsequent command sent by the amplifier as conducted in the method described in an eighteenth embodiment of the present invention.

In FIG. 17 showing the concept of Embodiment 18, when it is desired to define a point (absolute position) in any position as a reference point, a given command is sent by the amplifier. The absolute position detection apparatus stores this point PABSO into the nonvolatile memory 9, and thereafter, always outputs a value minus said value to the amplifier, thereby performing complete absolute position detection.

Alternatively, any point may be defined as a reference point of 0 by transmitting the value PBASO' from the amplifier and always outputting a value minus said value from the absolute position detection apparatus.

Embodiment 19

Figure 18:
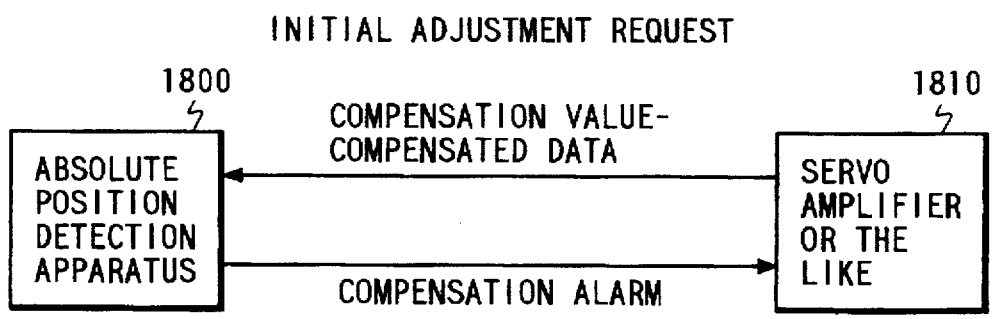
FIG. 18 is a conception diagram used to describe the initial adjustment method for the absolute position detection apparatus according to nineteenth embodiment of the present invention.

An initial adjustment method for the absolute position detection apparatus according to Embodiment 19 will now be described with reference to FIG. 18 which shows a connection between absolute position detecting apparatus 1800 and servo amp 1810. For the offset, amplitude, phase and other compensations which can be performed in real time, presetting their initial values in the proximity of the convergence values allows errors produced in the compensations of long convergence time to be avoided. Under a command from an external device (initial adjustment device), therefore, various compensations are carried out in sequence, and initial compensation values are redetermined and stored into the nonvolatile memory in an encoder. The initial adjustment device rotates the encoder at an appropriate, constant rotary speed and generates an offset compensation start command. The encoder performs initial adjustment according to applicable algorithms and determines compensation values. During this period, various data and predetermined compensation values are transmitted at the request of the adjustment device to allow the adjustment to be checked from the outside. Thereafter, the initial adjustments of the amplitude and phase compensations are made in a similar manner.

Embodiment 20

If the initial adjustment cannot be performed (e.g. if excessive offset values have caused the voltages to be clamped, resulting in distorted waveform), an alarm is generated and transmitted to the adjustment device.

Embodiment 21

Figure 19:
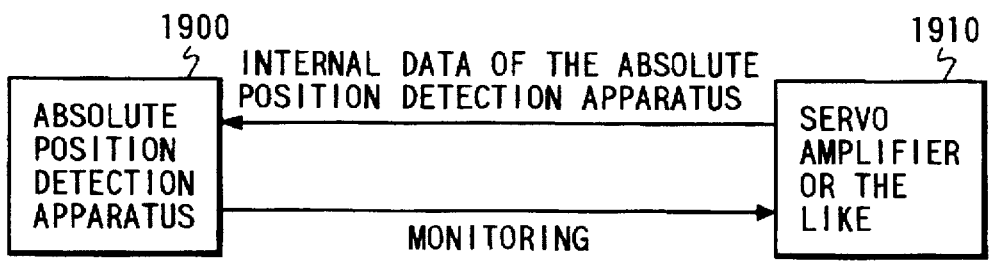
FIG. 19 is a conception diagram used to describe an initial adjustment method for an absolute position detection apparatus as described in a twenty-first embodiment of the present invention.

With data is allowed to be checked during actual operation, re-initial adjustment (when real-time compensations are not used) or an absolute position detection apparatus 1900 fault can be judged from the outside according to data to shut down the system. FIG. 19 shows the concept of this embodiment with the apparats 1900 connects to a servo amp 1910.

What is claimed is:

1. In an absolute position detection method wherein one or more sets of sine and cosine waves are generated within a cycle of a rotating device, the generated sine and cosine waves are analog-to-digital converted into digital values, and error compensation is performed using an arithmetic process to compensate for errors including offset, amplitude and phase errors on the digital values, the error compensation method comprises the steps of:

determining maximum and minimum values of the digital values, said maximum and minimum values representing peak values of the sine and cosine waves;

calculating an amplitude value for each of said sine and cosine waves using a difference between said maximum and minimum values;

determining an amplitude damping factor which varies as a function of an angular speed of said rotating device;

calculating an amplitude compensation factor for each of said sine and cosine waves as a function of said amplitude value, said amplitude damping factor and a reference amplitude value;

amplitude compensating each of said sine and cosine waves by multiplying each of said digital values by said amplitude compensation factor, thereby adjusting the amplitude of each of said sine and cosine waves to a reference amplitude.

2. The error compensation method as defined in claim 1, further comprising the steps of:

using a sum of said minimum and maximum values to determine an offset voltage for each of said sine and cosine waves;

for each of said sine and cosine waves, adjusting said digital values by said offset voltage to effect offset compensation.

3. The error compensation method as defined in claim 2, wherein higher-frequency sine and cosine waves are generated consecutively by arithmetic operation using the sine and cosine waves compensated for.

4. An error compensation method as defined in claim 1, further comprising the steps of:

when an angle of said digital values falls within predetermined ranges of 0°, 90°, 180° and 270°, calculating respective amplitudes R0, R90, R180 and R270 from a sum of the square of the digital value representing the sine wave and the square of the digital value representing the cosine wave;

determining an offset voltage for said cosine wave by comparing amplitude R0 at 0° with amplitude R180 at 180° which is 180° out of phase therewith and determining an offset voltage for said sine wave by comparing amplitude R90 at 90° with amplitude R270 at 270°; and for each of said sine and cosine waves, adjusting said digital values by said offset voltage to effect offset compensation.

5. The error compensation method as defined in claim 4, further comprising the steps of:

storing in a memory phase compensation values as a function of phase compensation angle $\alpha$;

when an angle of said digital values falls within predetermined ranges of 45°, 135°, 225° and 315°, calculating respective amplitudes R45, R135, R225 and R315 from a sum of the square of the digital value representing the sine wave and the square of the digital value representing the cosine wave;

determining the phase compensation angle $\alpha$ as a function of R45, R135, R225 and R315; and phase compensating the digital values representing said sine and cosine waves using the phase compensation values corresponding to the determined phase compensation angle $\alpha$.

6. The error compensation method as defined in claim 5, wherein higher-frequency sine and cosine waves are generated consecutively by arithmetic operation using the sine and cosine waves compensated for.

7. The error compensation method as defined in claim 5, wherein the phase compensation values are $\sin(\alpha)$ and $\cos(\alpha)$, and the phase compensation value $\alpha$ is incremented from a previous value when the quantity {R45+R225−R135−R315} is greater than 0, and decremented from a previous value when the quantity {R45+R225−R135−R315} is less than 0.

8. The error compensation method as defined in claim 4, wherein higher-frequency sine and cosine waves are generated consecutively by arithmetic operation using the sine and cosine waves compensated for.

9. The error compensation method as set forth in claim 1, further comprising:

storing in a memory a preset sine wave $\sin(\alpha)$ and a preset cosine wave $\cos(\alpha)$ as phase compensation values;

sequentially determining a waveform 90° out of phase with one of the generated sine and cosine waves from the phase compensation values and the digital values representing the generated sine and cosine waves.

10. The error compensation method as defined in claim 9, wherein said waveform 90° out of phase is calculated as:

$$\sin(APH) = \{\sin(AAM) + \cos(AAM)\sin(\alpha)\}/\cos(\alpha)$$

where $\sin(AAM)$ and $\cos(AAM)$ are the generated sine and cosine waves, $\sin(AAM)$ is shifted 90+$\alpha$ from $\cos(AAM)$, and $\sin(APM)$ is 90° out of phase with $\cos(AAM)$.

11. The error compensation method as defined in claim 1, wherein the amplitude damping factor decreases as function of the angular speed of said rotating device, and wherein the amplitude compensation factor equals the reference amplitude divided by the product of the amplitude value and the amplitude damping factor.

12. The error compensation method as defined in claim 1, wherein the amplitude damping factor is stored in a look-up table addressable by the angular speed of said rotating device.

13. The error compensation method as defined in claim 1, wherein the step of determining the maximum and minimum values comprises:

when an angle of a digital value is within a first predetermined range, comparing the digital value to a previous maximum value and storing the digital value as the maximum value if the digital value exceeds the previous maximum value;

when an angle of a digital value is within a second predetermined range, comparing the digital value to a previous minimum value and storing the digital value as the minimum value if the digital value is less than the previous minimum value.

14. The error compensation method as defined in claim 1, wherein the maximum and minimum values are determined by averaging maximum and minimum values detected in a plurality of cycles.

15. In an absolute position detection method wherein one or more sets of sine and cosine waves are generated within a cycle of a rotating device, the generated sine and cosine waves are analog-to-digital converted into digital values, and error compensation is performed using an arithmetic process to compensate for errors including offset, amplitude and phase errors on the digital values, the error compensation method comprising the steps of:

when an angle of said digital values falls within predetermined ranges of 0°, 90°, 180° and 270°, calculating respective amplitudes R0, R90, R180 and R270 from a sum of the square of the digital value representing the sine wave and the square of the digital value representing the cosine wave;

calculating an amplitude compensation factor for each of said sine and cosine waves as a function of R0, R90, R180 and R270;

determining an amplitude damping factor which varies as a function of an angular speed of said rotating device;

amplitude compensating each of said sine and cosine waves by multiplying each of said digital values by said amplitude compensation factor, thereby adjusting the amplitude of each of said sine and cosine waves to a reference amplitude.

16. The error compensation method as defined in claim 15, further comprising the steps of:

storing in a memory phase compensation values as a function of phase compensation angle α;

when an angle of said digital values falls within predetermined ranges of 45°, 135°, 225° and 315°, calculating respective amplitudes R45, R135, R225 and R315 from a sum of the square of the digital value representing the sine wave and the square of the digital value representing the cosine wave;

determining the phase compensation angle α as a function of R45, R135, R225 and R315; and phase compensating the digital values representing said sine and cosine waves using the phase compensation values corresponding to the determined phase compensation angle α.

17. The error compensation method as defined in claim 16, wherein higher-frequency sine and cosine waves are generated consecutively by arithmetic operation using the sine and cosine waves compensated for.

18. The error compensation method as defined in claim 15, wherein higher-frequency sine and cosine waves are generated consecutively by arithmetic operation using the sine and cosine waves compensated for.

19. An absolute position detection apparatus, comprising:

sine and cosine wave generators (1a, 1b, 2a, 2b) for generating one or more sets of sine and cosine waves within a cycle;

analog-to-digital converters (5a, 5b) for converting the incoming sine and cosine waves generated by said sine and cosine wave generators (1a, 1b, 2a, 2b) into digital values; and an arithmetic unit (17) for performing arithmetic to compensate for errors including offset, amplitude, and phase errors on the basis of the digital values from said analog-to-digital converters (5a, 5b), said arithmetic unit determining maximum and minimum values of the digital values, said maximum and minimum values representing peak values of the sine and cosine waves, calculating an amplitude value for each of said sine and cosine waves using a difference between said maximum and minimum values, determining an amplitude damping factor which varies as a function of an angular speed of said rotating device, calculating an amplitude compensation factor for each of said sine and cosine waves as a function of said amplitude value, said amplitude damping factor and a reference amplitude value, and amplitude compensating each of said sine and cosine waves by multiplying each of said digital values by said amplitude compensation factor, thereby adjusting the amplitude of each of said sine and cosine waves to a reference amplitude.

20. The absolute position detection apparatus as defined in claim 19, wherein said arithmetic unit uses a sum of said minimum and maximum values to determine an offset voltage for each of said sine and cosine waves, and for each of said sine and cosine waves, adjusts said digital values by said offset voltage to effect offset compensation.

21. The absolute position detection apparatus as defined in claim 19, further comprising:

a memory storing phase compensation values, wherein said arithmetic unit sequentially determines a waveform 90° out of phase with one of the generated sine and cosine waves from the phase compensation values and the digital values representing the generated sine and cosine waves.

* * * * *